United States Patent
Powell et al.

(10) Patent No.: US 6,607,982 B1
(45) Date of Patent: Aug. 19, 2003

(54) HIGH MAGNESIUM CONTENT COPPER MAGNESIUM ALLOYS AS DIFFUSION BARRIERS

(75) Inventors: Ronald A. Powell, San Carlos, CA (US); Sridhar K. Kailasam, Santa Clara, CA (US); E. Derryck Settles, Franklin, MA (US); Larry R. Lane, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 17 days.

(21) Appl. No.: 09/816,847

(22) Filed: Mar. 23, 2001

(51) Int. Cl.[7] .............................................. H01L 21/44
(52) U.S. Cl. ...................... 438/687; 438/627; 438/652; 438/653; 438/643; 438/618
(58) Field of Search ................................ 438/618, 622, 438/624, 626, 627, 628, 633, 637, 642, 643, 644, 652, 653, 654, 675, 680, 681, 648, 687; 257/751, 762

(56) References Cited

U.S. PATENT DOCUMENTS

| | | | | |
|---|---|---|---|---|
| 4,737,384 A | * | 4/1988 | Murthy et al. | 427/369 |
| 5,178,739 A | * | 1/1993 | Barnes et al. | 204/192.2 |
| 5,622,608 A | | 4/1997 | Lanford et al. | |
| 5,766,379 A | | 6/1998 | Lanford et al. | |
| 5,789,027 A | | 8/1998 | Watkins et al. | |
| 6,037,257 A | | 3/2000 | Chiang et al. | |
| 6,249,055 B1 | * | 6/2001 | Dubin | 257/758 |
| 6,387,805 B2 | * | 5/2002 | Ding et al. | 438/687 |

FOREIGN PATENT DOCUMENTS

JP  11-186273  * 9/1999 ....... H01L/21/3205

OTHER PUBLICATIONS

JP-11-186273 (Machine Translation).*
Peijun Ding, et al., "Copper Barrier, Seed Layer and Planarization Technologies," VMIC Conference, Jun. 10–12, 1997, pp. 87–92.
Tarek Suwwan de Felipe, et al., "Electrical Stability and Microstructual Evolution in Thin Films of High Conductivity Copper Alloys," IEEE, Jun., 1999, pp. 293–295.
Cho, et al., "Factors Affecting Passivation and Resistivity of Cu(Mg) Alloy Film," Materials Research Society Symposium Proc. vol. 564, 1999, pp. 353–358.
Murarka, et al., "Copper Metallization for ULSI and Beyond," Critical Reviews in Solid State and Materials Sciences, 1995., pp. 87–124.
Braeckelmann, et al., "Integration and Reliability of Copper Magnesium Alloys for Multilevel Interconnects," IEEE, Feb., 2000., pp. 236–238.
Arco, et al., "Intermetallic formation in copper/magnesium thin films—kinetics, nucleation and growth, and effect of interfacial oxygen," J.Appl. Phys. 76(9), Nov. 1, 1994, pp. 5161–5170.

(List continued on next page.)

Primary Examiner—Amir Zarabian
Assistant Examiner—Maria Guerrero
(74) Attorney, Agent, or Firm—Beyer Weaver & Thomas LLP (57) ABSTRACT

The present invention pertains to systems and methods for simultaneously producing a diffusion barrier and a seed layer used in integrated circuit metallization. This is achieved by initially depositing copper-magnesium (Cu—Mg) alloys with relatively high levels of Mg (>10 atomic %, which is equivalent to about >4 weight %). After the alloys are deposited, they self-form a magnesium oxide (MgO) based barrier layer at the substrate interface, thus eliminating the need for a separate operation for barrier deposition. The migration of Mg to the substrate interface leaves the remainder of the film relatively pure Cu.

20 Claims, 7 Drawing Sheets

OTHER PUBLICATIONS

Ding, et al., "Effects of the addition of small amounts of Al to copper: Corrosion, resistivity, adhesion, morphology, and diffusion," J. Appl. Phys. 75(7), Apr. 1, 1994, pp. 3627–3631.

T. Suwwan de Felipe, et al., "Bias–temperature stability of the Cu(Mg)/SiO$_2$/p–Si metal–oxide–semiconductor capacitors," J. Vac. Sci. Technol. B 15(6), Nov./Dec. 1997, pp. 1987–1986.

* cited by examiner

| Year | Technology Node (nm) | Maximum Cu-Mg Thickness (nm) | Minimum Interfacial Barrier (MgO) Thickness (nm) | Required Mg Concentration (at.%) |
|---|---|---|---|---|
| 1999 | 180 | 17 | 2 | 12.5 |
| 2002 | 130 | 13 | 2 | 16.5 |
| 2005 | 100 | 10 | 2 | 21.0 |

HIGH MAGNESIUM CONTENT COPPER MAGNESIUM ALLOYS AS DIFFUSION BARRIERS

FIELD OF THE INVENTION

The present invention pertains to systems and methods for simultaneously producing a diffusion barrier and a seed layer used in integrated circuit metallization. This is achieved by initially depositing copper-magnesium (Cu—Mg) alloys with relatively high levels of Mg (>10 atomic %, which is equivalent to about >4 weight %). After the alloys are deposited, they self-form a magnesium oxide (MgO) based barrier layer at the substrate interface, thus eliminating the need for a separate operation for barrier deposition. The migration of Mg to the substrate interface leaves the remainder of the film relatively pure Cu.

BACKGROUND OF THE INVENTION

Integrated circuit (IC) manufacturers have traditionally used aluminum, among other metals, as the conductive metal for interconnects in integrated circuits. While copper has a higher conductivity and greater electromigration resistance than aluminum, it has not been used in the past because of certain challenges it presents. For example, the adhesion of Cu to silicon dioxide ($SiO_2$) and to other dielectric materials is generally poor due to the low enthalpy of formation of the associated Cu compounds. Also, Cu ions readily diffuse into $SiO_2$ under electrical bias and increases the dielectric electrical leakage between lines even at very low Cu concentrations. In addition, if copper diffuses into the underlying silicon where the active devices are located, device performance can be degraded. Copper behaves as a defect in silicon resulting in the reduction of minority carrier lifetime, and hence, device degradation. Furthermore, Cu will also react with silicon at relatively low temperature to form copper silicides that increase contact resistance.

Recently, IC manufacturers have been turning to copper because of the development of Damascene processing that enables Cu interconnect metallization. Damascene processing involves formation of inlaid metal lines in trenches and vias formed in a dielectric layer (intermetal dielectric= IMD). However, the problem of the high diffusivity of copper in silicon dioxide ($SiO_2$) and in other IMDs remains of great concern.

To deal with this issue, an integrated circuit substrate must be coated with a suitable barrier layer that blocks diffusion of copper atoms. It is typically formed over the dielectric layer and prior to deposition of copper. The time, materials, and process complexity required to form a separate diffusion barrier layer introduces a significant cost to the overall fabrication procedure. Also, if the barrier is too thick, it can create problems with subsequent Cu coating and filling of ultra-fine features—e.g., a sub-0.1 $\mu$m diameter via.

The International Technology Roadmap for Semiconductors (ITRS 1999) states that barrier film thickness should be no thicker than 100 Å at the 0.10 $\mu$m technology node, and preferably as thin as possible. Cu—Mg alloys are one possible solution for forming diffusion barriers which meet this need and, using the methods disclosed herein, can be extended to future technology nodes as well. Cu—Mg alloys effectively promote adhesion to the intermetal dielectric and have a much lower resistivity compared to conventional diffusion barriers such as tantalum and tantalum nitride (tens of $\mu\Omega$-cm versus hundreds of $\mu\Omega$-cm). Possible procedures for forming Cu—Mg alloys of low Mg concentration (<<10 atomic %, typically about 1 atomic %, or 1 at. %) involve self-forming MgO barriers by Mg migration. With integrated circuits allowing large feature sizes, such low Mg concentration alloys could have been used because a thick alloy would contain enough Mg atoms to produce the desired MgO layer. However, feature sizes in ICs have already decreased to the point where the barrier thickness is limited to less than about 200 Å. Hence, the Cu—Mg alloy that is less than 200 Å needs to contain high percentage of Mg (greater than 10 atomic %) to form a robust MgO barrier. The relationship between the minimum Mg content in the alloy and the maximum allowable Cu—Mg thickness will be presented in the body of this patent.

High Mg content Cu—Mg alloys have several associated problems. For example, Mg like many other dopants, greatly increases the resistivity of copper for any excess Mg, i.e., unreacted Mg, that stays within the alloy layer. The increased resistivity tends to negate the advantage offered by low-resistivity Cu—Mg alloys that can act as a seed layer for subsequent electrochemical deposition of copper. Excess Mg can also migrate to the exposed surface of the alloy layer, thus forming a MgO layer upon exposure to air that can interfere with the Cu electroplating step. The unreacted Mg may also diffuse out of the seed layer and into adjacent Cu interconnects and vias, increasing the Cu resistivity in those areas to unacceptable levels (>2.0 $\mu\Omega$-cm).

What is therefore needed is a process for forming a single layer out of high Mg-content Cu—Mg alloys that obviates these and other problems, and simultaneously serves as a robust barrier to Cu diffusion and conductive seed layer for subsequent operations. In conventional IC nomenclature, the diffusion barrier and the seed layer are two separate films. Since this invention contemplates the use of a single metallic film for both applications, it is important to note that the alloy layer provides for the formation of an interfacial diffusion barrier (interfacial meaning the interface between the dielectric and the metallization layer) whereas the remainder of the alloy serves as the seed layer. In other words, the Cu—Mg alloy layer is equivalent to the barrier film according to conventional nomenclature even though in the case of Cu—Mg alloy films, the interfacial diffusion barrier is much thinner than the overall alloy layer thickness.

SUMMARY OF THE INVENTION

The present invention pertains to systems and methods for simultaneously producing a diffusion barrier and a seed layer used in integrated circuit metallization. This is achieved by initially depositing copper-magnesium (Cu—Mg) alloys with relatively high levels of Mg (>10 atomic %, which is equivalent to about >4 weight %). After the alloys are deposited, they self-form a magnesium oxide (MgO) based barrier layer at the substrate interface, thus eliminating the need for a separate operation for barrier deposition. The migration of Mg to the substrate interface leaves the remainder of the film relatively pure Cu. The amount of Mg is calculated to provide a continuous layer of MgO barrier. Thus, one should control the absolute amount of magnesium—rather than a percentage concentration of magnesium—in the alloy layer. The deposition and annealing conditions are controlled so that most of the Mg migrates to the dielectric to form the MgO, leaving little Mg in the bulk of the copper alloy or at the exposed alloy surface.

One aspect of the invention provides for a method of forming, from a single copper alloy layer, a self-forming diffusion barrier layer and a copper seed layer. The method includes depositing the single copper alloy layer on a dielectric material wherein the single copper alloy layer contains at least 10 atomic percent magnesium and whereby the single copper alloy layer can react with the dielectric material and self-form a diffusion barrier layer at the interface between the single copper alloy layer and the dielectric material. Another aspect of the invention provides for a method of forming, from a single copper alloy layer, a self-forming diffusion barrier layer and a copper seed layer. The method includes depositing the single copper alloy layer on a dielectric material wherein the single copper alloy layer contains another metal and whereby the single copper alloy layer can react with the dielectric material and self-form a diffusion barrier layer at the interface between the single copper alloy layer and the dielectric material, and wherein the other metal is boron, tantalum, aluminum, titanium, or beryllium.

Both of these methods can include a dielectric material that is oxide-based or polymer-based. In the magnesium aspect, the self-forming barrier layer can be magnesium oxide or magnesium silicon oxide. The single copper alloy layer can be deposited by using a cathode target with separate copper and magnesium sections, and using a hollow-cathode magnetron. The single copper alloy layer can be less than about 1500 Å thick and the diffusion barrier layer greater than 10 Å thick. An annealing operation can be implemented for about 50 to 500 seconds and where the temperature is between about 50 to 500° C. Part or all annealing operation can be carried out under vacuum. After deposition of the single copper alloy layer, additional copper can be deposited. The methods can be carried out as part of integrated circuit process such as Damascene processing.

Another aspect of the invention provides for an integrated circuit or partially fabricated integrated circuit that includes a dielectric material and a single copper alloy layer on the dielectric material, wherein the single copper alloy layer contains at least 10 atomic percent magnesium. The circuit can include a dielectric material that is oxide-based or polymer-based. The single copper alloy layer can be deposited by using a cathode target with separate copper and magnesium sections, and using a hollow-cathode magnetron. The single copper alloy layer can be less than about 1500 Å thick and the diffusion barrier layer can be greater than 10 Å thick. An annealing operation can be implemented for about 5 to 500 seconds and where the temperature is between about 50 to 500° C. The circuit can be fabricated as part of integrated circuit process such as Damascene processing.

Another aspect of the invention provides for a method of forming, from a single layer, a self-forming barrier layer. The method includes depositing the single layer on a dielectric material wherein the single layer contains about 100 atomic percent magnesium and whereby the single layer can react with the dielectric material and self-form a barrier layer at the interface between the single layer and the dielectric material. Another aspect of the invention provides for a method of forming, from a single layer, a self-forming barrier layer. The method includes depositing the single layer on a dielectric material wherein the single layer contains a metal whereby the single layer can react with the dielectric material and self-form a barrier layer at the interface between the single layer and the dielectric material, and wherein the other metal is boron, tantalum, aluminum, titanium, or beryllium.

Both of these methods can include a dielectric material that is oxide-based or polymer-based. In the magnesium aspect, the self-forming barrier layer can be magnesium oxide or magnesium silicon oxide. The single copper alloy layer can be less than about 1500 Å thick and the barrier layer greater than 10 Å thick. An annealing operation can be implemented for about 5 to 500 seconds and where the temperature is between about 50 to 500° C. The methods can be carried out as part of integrated circuit process such as Damascene processing.

Another aspect of the invention provides for an integrated circuit or partially fabricated integrated circuit that includes a dielectric material and a single layer on the dielectric material, wherein the single layer contains about 100 atomic percent magnesium. The barrier layer can be greater than about 10 Å thick. An annealing operation can be implemented for about 5 to 500 seconds and where the temperature is between about 50 to 500° C. The circuit can be fabricated as part of integrated circuit process such as Damascene processing.

These and other features and advantages of the present invention will be described in more detail below with reference to the associated drawings.

DETAILED DESCRIPTION OF THE PREFERRED EMBODIMENTS

In the following detailed description of the present invention, certain specific embodiments are set forth in order to provide a thorough understanding of the invention. However, as will be apparent to those skilled in the art, the present invention may be practiced without using all of the specific features and operations described herein. Often, alternate elements or processes may be substituted without loss of the desired function. In some instances well-known processes, procedures and components have not been described in detail so as not to unnecessarily obscure aspects of the present invention.

Generally, the present invention applies in any context or application in which a thin copper alloy layer is formed on a substrate surface. The invention has particular benefits when the thin copper layer coats an oxygen-containing layer, such as a silicon oxide dielectric layer. The magnesium in the Cu—Mg layer then forms a diffusion barrier of magnesium oxide at the interface of the copper and dielectric layer. However, the invention also finds application in coatings for other types of dielectric material such as polymeric materials. In such cases, the magnesium will react at the interface of the alloy and the dielectric to form a compound such as magnesium nitride that could serve as the diffusion barrier. In many preferred embodiments, the thin copper alloy layer will provide a conductive seed layer for subsequent copper electroplating.

A "semiconductor wafer" is a semiconductor substrate at any state of manufacture in the production of integrated circuits. One standard semiconductor wafer described in this invention is 200 mm in diameter, 0.75 mm thick (see e.g., SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997. As used herein, "substrate surface" refers to any surface whereupon a copper alloy layer is to be deposited. Substrate surfaces include, but are not limited to, semiconductor substrate surfaces in various states of manufacture, including surfaces on which the barrier layer has just been deposited. Preferably, the substrate surface is substantially covered with a dielectric layer such as an oxide layer (e.g., silicon dioxide or silicon oxynitride or carbon-doped silicon oxide) or a polymer-based layer.

The current invention is compatible with any sort of semiconductor manufacturing where a thin "seed" layer of copper must be deposited. A particular integrated circuit fabrication process that is compatible with the invention is the Damascene process, including the dual Damascene process, but the current invention is not limited to Damascene processing or integrated circuit fabrication processes in general.

Figure 1:
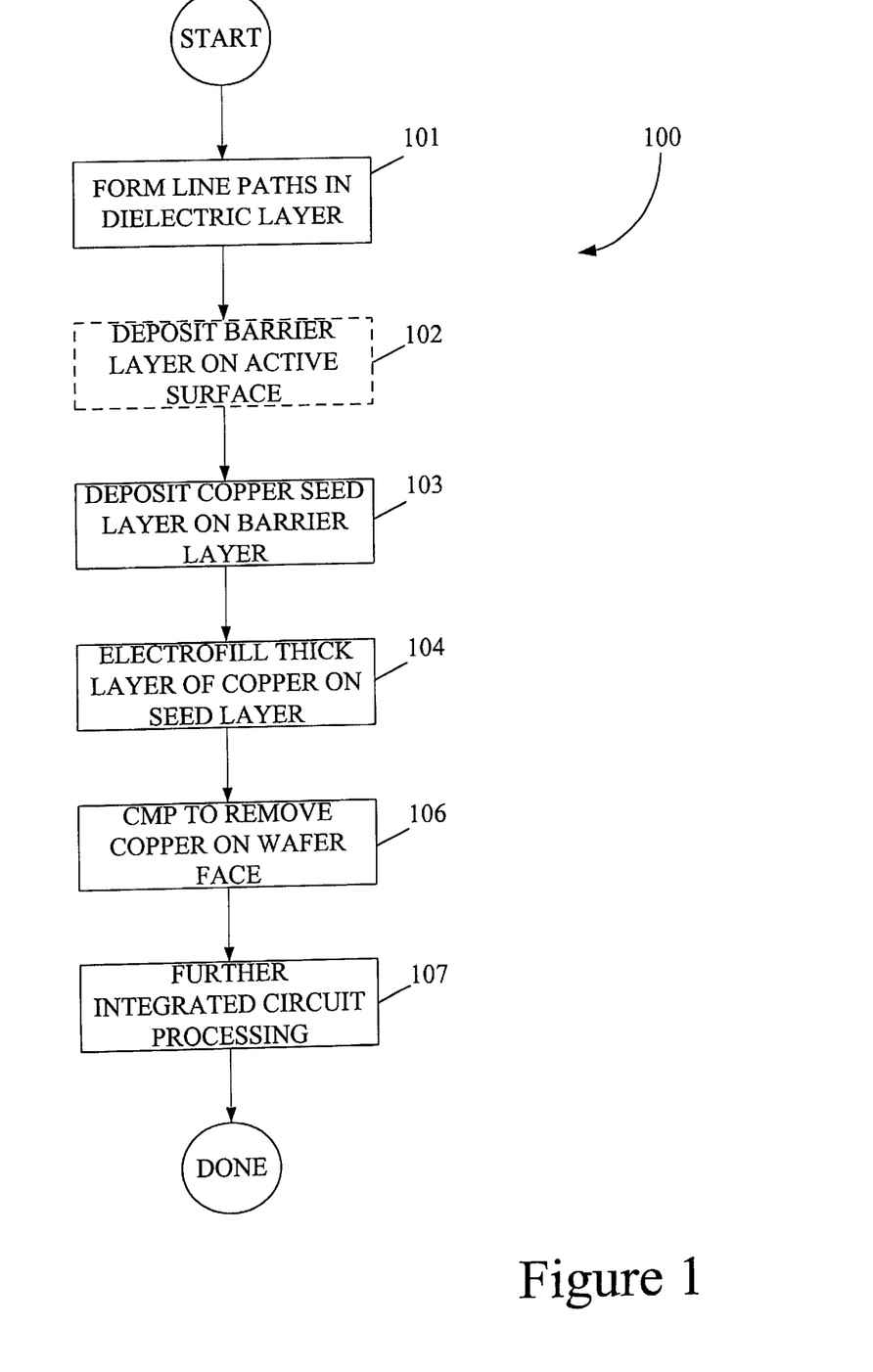
FIG. 1 is a process flow diagram illustrating relevant operations employed to form conductive copper lines by Damascene processing.

A typical Damascene process flow 100 is illustrated in the flowchart of FIG. 1 in order to contextualize the present invention. Process 100 begins with formation of line paths in a previously formed dielectric layer. See 101. These line paths may be etched as trenches and vias in a blanket layer of dielectric such as silicon dioxide. The line paths define conductive routes between various devices on a semiconductor wafer. Copper provides the conductive paths of the semiconductor wafer. The adjacent dielectric layer and silicon devices must be protected from Cu ions that might otherwise diffuse into the dielectric layer and/or silicon. To accomplish this, the process optionally includes depositing a thin diffusion barrier layer before deposition of Cu. See 102. Suitable materials for the diffusion barrier layer include tantalum (Ta), tantalum nitride ($TaN_x$), tungsten (W), titanium (Ti), titanium tungsten (Ti-W), and the like. The barrier layer is typically formed by a PVD or a chemical vapor deposition (CVD) process. In the present invention, this barrier self-forms out of the deposited copper alloy layer, rendering 102 unnecessary as a separate operation.

Before inlaying the line paths with electrochemical deposition of copper, a conductive surface coating must be applied. In the depicted process, this is accomplished by depositing a copper seed layer at 103. In the current art, the copper seed layer would be deposited on the previously deposited barrier layer from 102, but in this invention, the copper seed layer is deposited directly on the dielectric. This seed layer is typically deposited by a PVD process. The properties of the seed layer pertain directly to the current invention, as will be discussed in detail below. Next, as indicated at 104, a much thicker layer of copper is deposited on the seed layer. This operation is typically carried out by an electrochemical deposition procedure such as electroplating or electrofilling. It can also be carried out be non-electrochemical procedures, for example, supercritical fluid deposition, which uses a supercritical or near-supercritical solvent to carry the copper. For a further description of supercritical fluid deposition, see U.S. Pat. No. 5,789,027 issued to Watkins et al. on Aug. 4, 1998.

After deposition of the copper is completed, the copper is planarized, generally by chemical mechanical planarization (CMP) and/or electropolishing down to the dielectric at 106 in preparation for further processing 107, generally the addition of subsequent dielectric and metallization layers.

In the context of integrated circuit fabrication processes, this invention is typically carried out on a dielectric substrate. The dielectric layer may be an intermetal dielectric (IMD) or an interlayer dielectric (ILD). In either case, the substrate will already have surface features such as vias and channels etched into the dielectric. In the latter case, the substrate will also include areas of electrofilled copper from the completed lower layers.

Figure 2:
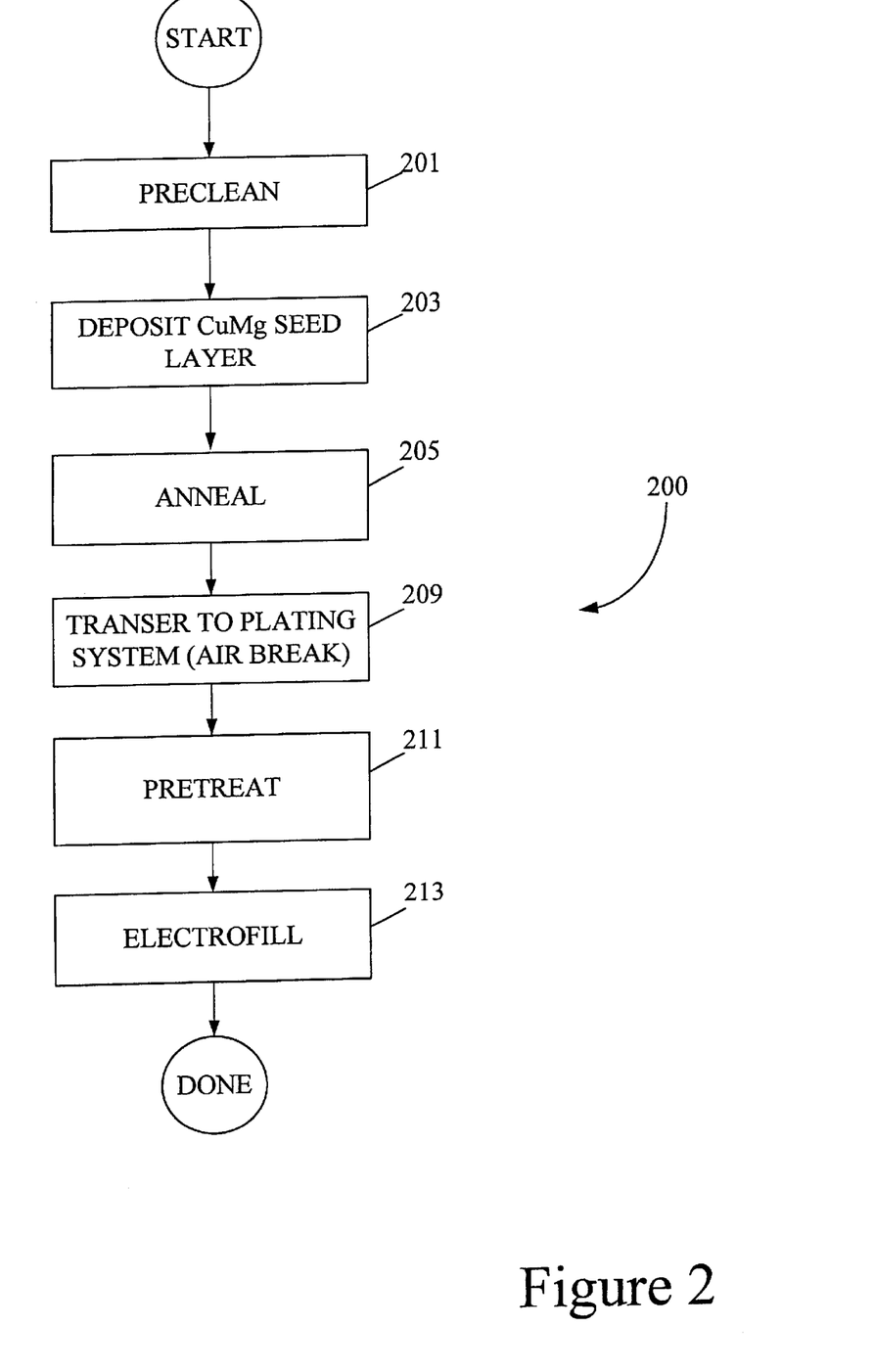
FIG. 2 is a process flow diagram illustrating relevant operations employed to form copper-magnesium layer that self-forms a barrier layer as well as a seed layer for subsequent processing.

A high-level description of a process 200 of the present invention is illustrated in the flowchart of FIG. 2. Blocks 201 through 211 represent operations that may be subsumed within the general seed layer deposition operation 103 shown in FIG. 1. While this description is discussed in the context of a Damascene process, it is not limited to just this type of integrated circuit fabrication process. A pre-clean operation is carried out to remove any unwanted materials, such as copper oxide or residues from plasma etching, from the underlying electrofilled copper or other conductive surface (e.g., polysilicon or metal silicide). See 201. This pre-cleaning is typically done by a physical sputter etch using an inert gas plasma (e.g., argon) to remove the unwanted materials, and/or by a reactive pre-clean which involves the use of a reducing plasma (e.g., argon-hydrogen plasma) to chemically reduce copper oxide back to copper.

Deposition of the Cu—Mg alloy is then carried out by PVD or other suitable process such as CVD. See 203. This resulting layer ultimately serves to provide the interfacial diffusion barrier layer and the seed layer for electrochemical deposition. The conditions and parameters of this operation are described in more detail below. After the deposition of the Cu—Mg layer, an optional but preferred annealing operation is performed. See 205. The purpose of the annealing operation is to drive magnesium to the dielectric-alloy interface to form an interfacial barrier (MgO) layer. In one embodiment, the operation involves heating the wafer to facilitate oxidation of the magnesium at the dielectric interface. Preferably, the annealing is done in a vacuum system (e.g., in an integrated fashion in a cluster tool) or in an inert ambient to ensure that all or most of the unreacted magnesium that migrates to the surface is evaporated. This prevents significant MgO formation at the Cu—Mg free surface as described below.

Thermal diffusion of Mg within the film is a random process; however, when Mg reaches the $SiO_2$ interface, it readily reduces the $SiO_2$ to form MgO. As long as no significant amount of oxidant such as $O_2$ or $H_2O$ vapor is available to form MgO at the free surface, the chemical sink of Mg results in a concentration gradient that promotes net transport of Mg to the Cu—Mg/$SiO_2$ interface.

In a specific embodiment, the annealing has two operations. In the first operation, the wafer is exposed to a low temperature anneal (less than about 300° C.) in the deposition chamber for about 5 to 500 seconds in order to facilitate migration of the Mg to the dielectric interface and to oxidize the magnesium to magnesium oxide. Next, the wafer is transferred to another chamber where the second anneal operation is carried out. In the second anneal operation, the wafer is exposed to a higher temperature (greater than about 350° C.) in vacuum, which also facilitates magnesium oxide formation at the dielectric interface, but is mainly to ensure evaporation of any unreacted magnesium that has migrated to the free surface. A two-operation anneal serves to improve the conductivity and purity of the bulk of the Cu alloy seed, thereby facilitating subsequent electrochemical deposition.

Figure 3A:
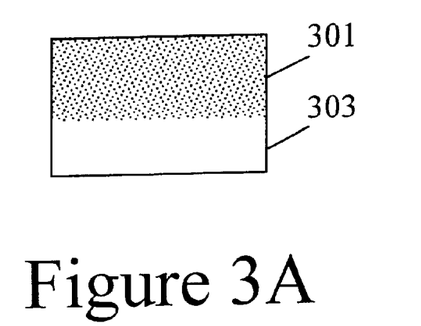
FIGS. 3A–3C schematically illustrate a deposited Cu—Mg layer, with subsequent migration of Mg atoms to form the MgO barrier layer at the dielectric interface.
Figure 3B:
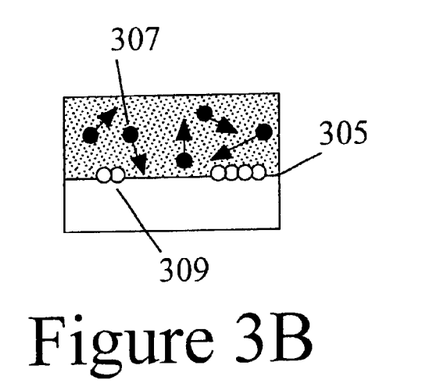
Figure 3C:
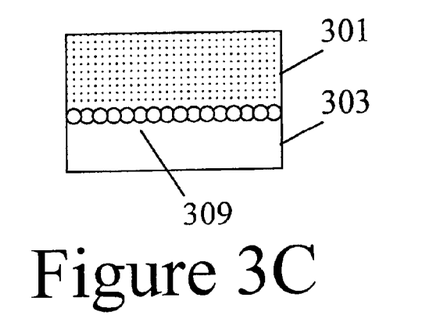

FIGS. 3A–3C schematically illustrate the migration of the magnesium to the dielectric interface and its subsequent oxidation. FIG. 3A shows a layer of copper-magnesium 301 deposited on top of dielectric 303. FIG. 3B shows the subsequent thermal diffusion of the magnesium atoms 307, which is accelerated by the annealing operation. Some of the magnesium thus migrates to the dielectric interface 305 and is immediately oxidized to magnesium oxide 309. FIG. 3C shows the now relatively dilute layer of copper alloy 301 and the self-forming barrier layer 309 of magnesium oxide lying underneath.

Other embodiments of the anneal operation are possible, as long as the twin goals of MgO formation at the dielectric interface and removal of unreacted Mg at the free surface are accomplished. This insures a robust barrier and a high conductivity Cu alloy seed that approximates a pure Cu seed. In some embodiments, these goals may be achieved without an explicit anneal, though annealing often will cause the MgO barrier to form more quickly, which thus helps IC manufacturing throughput. If the Cu—Mg layer is very thin (less than about 50 Å) or is composed of very high content or even pure Mg, then the MgO formation may occur fast enough on its own, though a vacuum anneal might still useful to evaporate Mg from the surface. It should be noted that Mg has a very high vapor pressure at moderate temperatures near 400° C. that facilitates the aforementioned surface removal process.

Figure 4A:
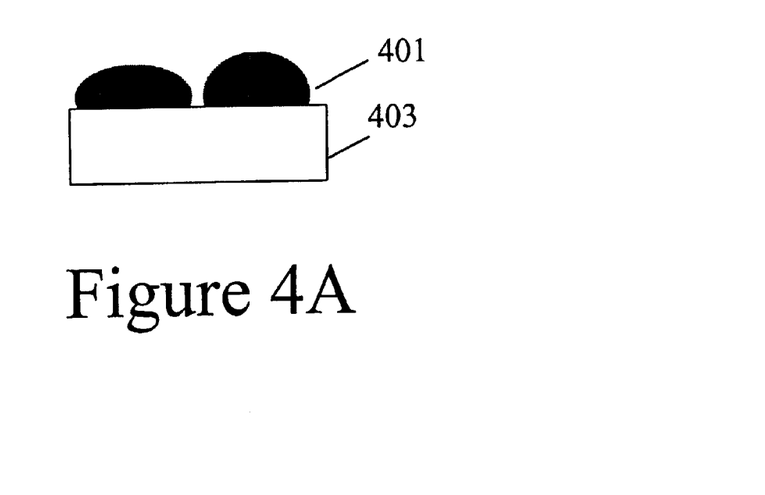
FIGS. 4A–4C schematically illustrates an alternative embodiment in which the Cu—Mg seed layer is deposited in two operations and the barrier formation also occurs in two operations.
Figure 4B:
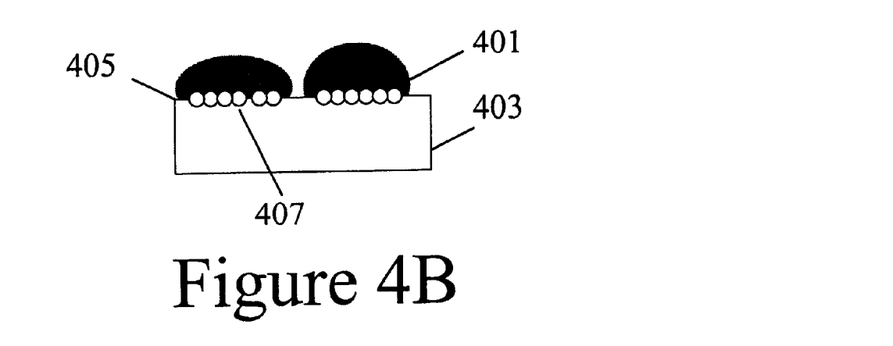
Figure 4C:
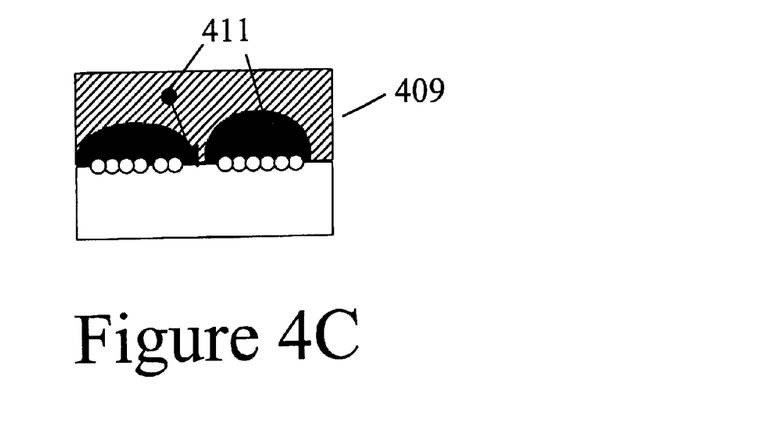

In another embodiment of the invention, the Cu—Mg deposition is carried out in two separate deposition operations (preferably PVD depositions, but could include other methods such as CVD). The optional annealing operation could be carried out twice, once after each deposition or only once after both depositions. Thus, in this embodiment the operations 203 and 205 are carried out twice. This embodiment is designed mainly to compensate for the fact that Cu deposition (particularly by PVD) is sometimes not completely continuous and non-conformal. This may result in gaps on the dielectric surface especially within high aspect ratio ultra-fine features (e.g., a 0.1 µm diameter via with an aspect ratio greater than 10:1). Aspect ratio is defined as the ratio of the height of the feature to its width. In this embodiment, the deposition operation and annealing operations are carried out in much the same manner as described above. FIG. 4A illustrates a discontinuous coverage of the Cu—Mg 401 regions (shown as beads) on the dielectric 403. The annealing operation will facilitate Mg migration and oxidation to MgO, as illustrated in FIG. 4B, which shows regions of MgO 407 forming a discontinuous barrier layer at the dielectric interface 405. Next, another deposition is carried out, typically a Cu—Mg alloy lower Mg content or even pure Cu, in order to fill in the gaps left by the previous deposition. The second film provides a diffusion path for Mg atoms. FIG. 4C shows a second Cu—Mg or Cu deposition layer 409 formed as a result of this process. Magnesium atoms 411 present in both the first and second deposition can then migrate during anneal following the second deposition to the portions of the dielectric interface that did not have any MgO barrier before in order to form a continuous MgO barrier layer. If the second layer 409 has a relatively low concentration of magnesium, then very few magnesium atoms will diffuse to the surface of layer 409, where their presence could interfere with a subsequent deposition reaction.

Returning to process flow 200, the next operations, 209, 211 and 213, essentially correspond to the Damascene electrofill operation 104 described above. The IC wafer, with its deposited Cu—Mg layer is transferred to a plating system, 209, to fill in a thicker layer of copper to complete the conductive routes. This operation typically involves an air break; that is, the IC wafer is exposed to air while it is being transferred to the plating system. This operation may also involve some storage time before the wafer is placed in the plating system, which also typically involves exposure to air.

The amount of MgO on the IC wafer surface prior to plating should be minimal, due to the manner in which the invention is practiced, which is described in more detail below. The thickness of this MgO layer is less than 100 Å typically, and less than 50 Å if the annealing operations described earlier in this invention are practiced. The wafer is then introduced into the plating solution. Since a conventional plating solution is highly acidic (e.g., a typical plating bath consists of 0.1M sulphuric acid with added $CuSO_4$ and organic additives), a brief exposure of the bath for 0–10 seconds at room temperature will remove the insulating surface MgO, leaving behind a conductive surface needed for electrochemical plating. If the plating solution chemistry does not dissolve any residual surface MgO, than the IC wafer could be pretreated, 211, before the plating operation 213. In one embodiment, the pretreatment could involve exposing the copper alloy layer to an acid bath to remove any MgO that may have formed at the surface.

Copper-magnesium Seed Layer Composition

Because one goal of the present invention is to produce an effective barrier layer that includes magnesium oxide, the composition of the copper-magnesium seed layer should be selected to provide enough magnesium to allow formation of such barrier layer.

To this end, the composition will be dictated at least in part by such parameters as (1) the minimum thickness of an interfacial magnesium oxide-based barrier layer; (2) the thickness of the alloy layer available to donate magnesium atoms ("magnesium atom reservoir"); and (3) the fraction of the total magnesium from the copper-magnesium alloy that can contribute to the interfacial barrier layer. Note that some magnesium will usually remain in the copper film to satisfy solid solubility requirements (typically <0.5at. % at room temperature).

It appears that an interfacial barrier film on the order of 10 Å will actually be sufficient to effectively block copper diffusion. This invention is not limited to devices and structures employing this or any other thickness of magnesium oxide, but a 20 Å thickness for the MgO barrier is here used as an example for calculating the minimum amount of magnesium required.

For illustration purposes, the dielectric is assumed to be oxide-based such as $SiO_2$. Hence, the interfacial barrier is expected to be MgO. Given the density of MgO is 3.58 g/cm$^3$, the concentration of magnesium atoms in a pure MgO layer can be calculated to be $5.35 \times 10^{22}$ magnesium atoms/cm$^3$ (using Avogadro's constant and the formula weight of MgO). For a MgO thickness of 20 Å ($2 \times 10^{-7}$ cm), the number of magnesium atoms per unit surface area of oxide is $1.07 \times 10^{16}$ atoms/cm$^2$. This areal density of magnesium atoms must be donated by the Cu—Mg alloy (the "Mg atom reservoir"). From this assumption, a minimum concentration of magnesium atoms can be calculated for a given thickness of the alloy layer by the following equation:

$$107 \times 10^{16} \text{ Mg atoms/cm}^2 = \frac{\text{Avogadro's \#} \times \text{Alloy Density} \times \text{Mg Concentration} \times \text{Alloy Thickness}}{\text{Mass of Alloy}}$$

Assuming that the density of the alloy scales linearly from pure Mg to that for pure Cu, the following equation then determines the fraction of Mg atoms 1–x) in a 100 Å $Cu_x$—$Mg_{1-x}$ alloy (100 Å is obtained from the ITRS roadmap for the year 2005)

$$107 \times 10^{16} \text{ Mg atoms/cm}^2 = \frac{6.023 \times 10^{23} \text{ atoms} \cdot [1.74 + 7.24x \text{ g/cm}^3] \cdot [1-x] \cdot [100 \times 10^{-4} \text{ cm}]}{[63.5x + 24.3(1-x)]}$$

Solving for x results in x=86.7at. %. Hence, the Mg concentration 1–x) would be 13.3at. %. Suitable values for other processes can be obtained by substituting for the thickness of the copper film for such processes.

Note also that if a thicker or thinner magnesium oxide barrier layer is required, then the value $1.07 \times 10^{16}$ magnesium atoms required per square centimeter based on 20 Å MgO film will need to be modified accordingly. As mentioned, the invention is not specifically limited to designs requiring the assumed thickness (20 Å) of magnesium oxide barrier layer.

Another factor to consider is that not all of the Mg from the Cu—Mg alloy segregates to the alloy-oxide interface to form the interfacial barrier. Secondary ion mass spectroscopy (SIMS) characterization of blanket Cu—Mg film conducted as part of our research indicates that approximately $\frac{2}{3}^{rd}$ of the Mg from the alloy segregates to the alloy-oxide interface under typical processing conditions. In addition, about 0.5at. % remains in the "bulk" of the alloy to satisfy the solid solubility requirement of Mg in Cu at room temperature. Thus, nearly $\frac{1}{3}^{rd}$ of the Mg does not react at the substrate-alloy interface. At least some of this magnesium migrates to the exposed surface, where it will form MgO if oxygen or air is present during processing or storage.

In the end, the required Mg concentration, under typical process conditions, is actually greater than that calculated assuming that all magnesium reacts to form the interfacial barrier layer. Thus, an improved approximation of magnesium concentration assumes that only a fraction of the total magnesium in the alloy actually diffuses to the interface with the dielectric and reacts to form magnesium oxide. Assuming that only two-thirds of the total magnesium is available for reaction, then the values calculated above would have to be multiplied by a factor of $1/(\frac{2}{3})=\frac{3}{2}=1.5$.

Figure 5:
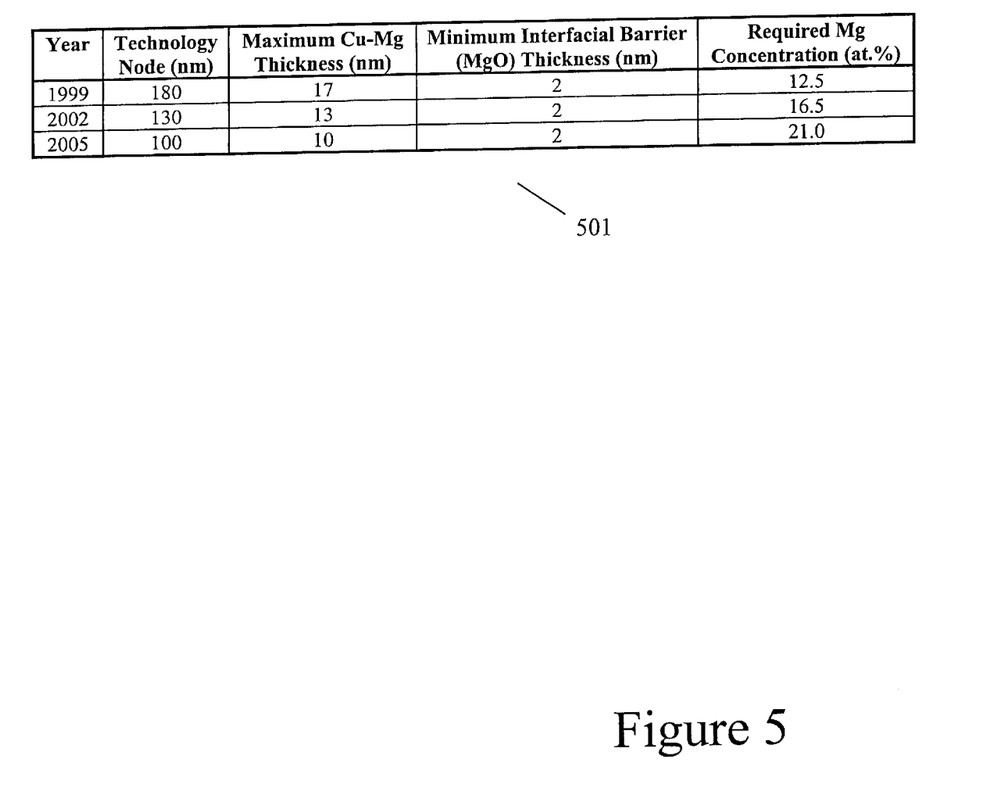
FIG. 5 illustrates an equation used to calculate the Mg content required in a copper alloy layer to form an adequate barrier layer for varying alloy layer thicknesses and a fixed interfacial barrier thickness.

Based on the assumption that a 20 Å MgO barrier layer, the total Mg concentration required in the alloy is expected to be ~21at. % for a 100 Å Cu—Mg layer —which is 10 × greater than the dilute levels that have been considered as usable in the past for Cu—Mg alloys. Similar calculations were carried out to evaluate the minimum concentration of Mg in the Cu—Mg alloy as the maximum allowable alloy thickness is changed to 170 Å and 130 Å corresponding to 0.18 μm and 0.13 μm technology nodes, respectively. The results are presented in the table 501 of FIG. 5 for various alloy layer thickness and assuming that a 20 Å layer of MgO is sufficiently good diffusion barrier. The projected year in which these films will be implemented by the IC industry is also shown.

Using the above criteria, it is concluded that the concentration of magnesium in the alloy layer varies as a function of alloy layer thickness. Thus, it is expected that the minimum concentration of magnesium will increase with each new generation of process technology. It is safe to assume that the required concentration of magnesium will be at least 10 atomic percent. Thus, one aspect of the invention provides for the use of copper alloy films on substrates, where such films include at least about 10 atomic percent magnesium. With future generations of process technology, the preferred concentration will likely move to at least about 20 atomic percent magnesium. Note that this invention contemplates the situation where the seed layer is essentially pure magnesium (i.e., little or no copper is present). Other embodiments of the present invention make use of aluminum, tantalum, boron, beryllium, or titanium in combination with the copper. Such combinations in a seed layer will self-form an effective barrier layer underneath the copper. The protocols and amounts used are similar to those described for the Mg embodiment.

PVD Apparatus

The Cu—Mg alloy is deposited by any suitable process. In a preferred embodiment, it is deposited by sputter deposition process, sometimes referred to as physical vapor deposition (PVD). An argon plasma provides argon ions that strike a metal target, thereby sputtering Cu and Mg atoms out into the chamber and onto the substrate surface. Among the PVD plasma sources, planar magnetrons and hollow-cathode magnetrons (HCM) are commonly used. Cu—Mg alloy targets are not preferred for practicing the invention. The hardness of Cu—Mg alloys greatly increase above about 2at. %, thus making the fabrication of sputter targets very difficult. Since the present invention requires much higher Mg contents than this, the use of Cu—Mg alloy targets is even more difficult.

Figure 6:
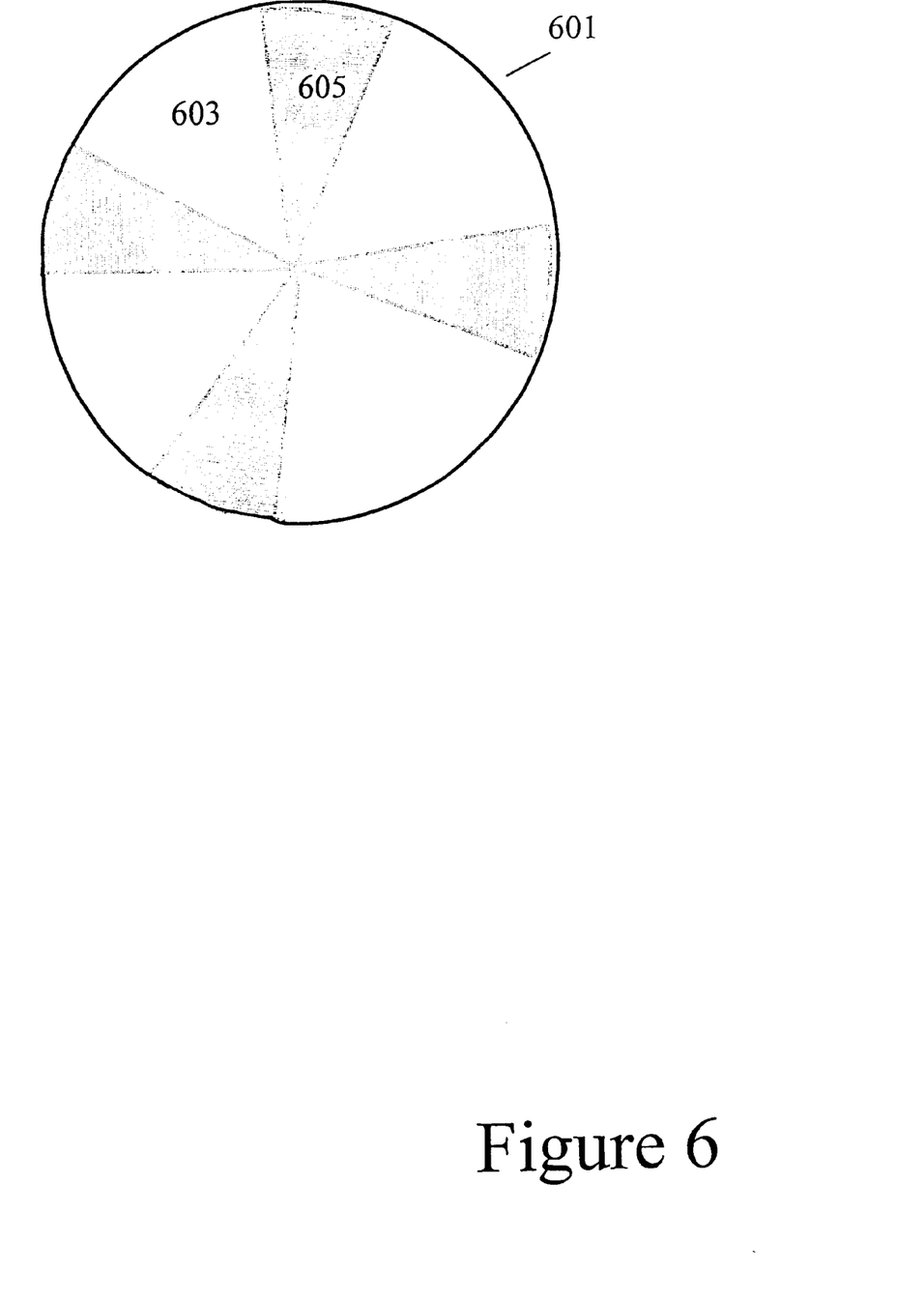
FIG. 6 schematically illustrates a composite Cu—Mg flat planar target as used in one embodiment of the current invention.

These considerations and others have been taken into account to design viable metal targets for practicing the present invention, resulting in a variety of design embodiments for the target. In order to sputter both Cu and Mg, but to avoid the above-described problems with a Cu—Mg alloy target, composite targets have been designed with separate areas of elemental Cu and elemental Mg. For instance, FIG. 6 schematically illustrates a design for a planar target 601 that is made up of separate Cu 603 and Mg 605 sections arranged in a contiguous pattern of wedges (i.e., a "pizzapie" type of pattern). This is compatible with the planar magnetron embodiment of the invention. Other arrangements are possible, as long as pure Cu and pure Mg are in separate sections. The Mg content of the resulting Cu—Mg film can easily be controlled by changing the relative surface areas of the Cu and Mg target sections. For example, a composite target with a 4% surface area of Mg and a 96% surface area of Cu will yield a Cu—Mg film of about 7.7% Mg (noting that the sputter yield of pure Mg is about twice that of pure Cu, thus (2×4%)/(2×4%+1×96%))=7.7%. In practice, the area ratio may be altered slightly to account for the differences in transport behavior of Mg and Cu ions or atoms to the wafer surface. For instance, scattering of Cu and Mg ions or atoms with argon gas in the sputter chamber. The Cu and Mg sections are typically soldered to the back of the cathode with a soldering material such as indium metal.

Figure 7:
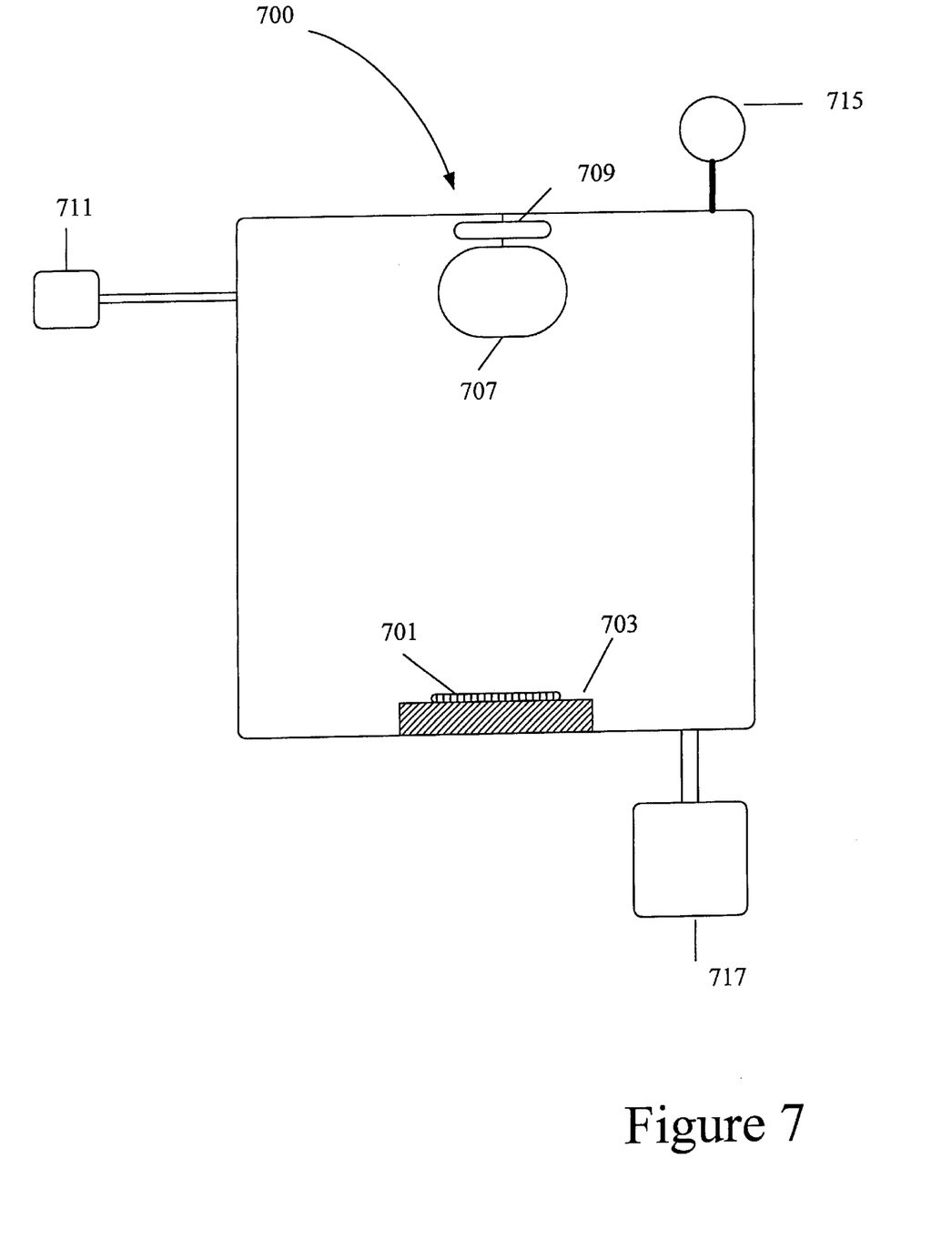
FIG. 7 schematically illustrates a physical vapor deposition (PVD) apparatus suitable for practicing the present invention.

FIG. 7 schematically depicts a PVD system 700, in which the invention may be practiced. Inside the apparatus chamber, the semiconductor wafer 701, sits on top of a supporting pedestal 703. The supporting pedestal 703 typically has thermocouple or other temperature sensing mechanism attached to it to precisely monitor the temperature of the wafer. The wafer can be heated by any number of commonly-known methods, such as a heated wafer chuck that is thermally coupled to the wafer by a backside gas pressure. The apparatus includes a cathode target 707 with a negative electrical bias on it and a magnetron 709. A DC plasma is produced when a negative bias is applied to the target, and the magnetic fields produced by the magnet array behind the target produce an intense plasma discharge at the target surface. Bombardment of the target by positively ionized Ar ions from this gas plasma then sputters atoms from the target and toward the wafer positioned below. The argon gas is introduced by an argon gas source 711. The system also includes a pressure gauge 715 and a pump 717 for controlling the flow of gases.

While $SiO_2$ is the most common dielectric substrate used in IC manufacturing and compatible with the present invention, other dielectric substrates can be used. Of particular interest to advanced IC processing are dielectric materials with low dielectric constant k much lower than the k=3.9 value of $SiO_2$. These include fluorinated silica glass (FSG), nanoporous and mesoporous silica, and carbon-doped silicon oxides such as CORAL™, which is available from Novellus Systems, Inc., of San Jose, Calif., BLACK DIAMOND™, which is available from Applied Materials, Inc., of Santa Clara, Calif., and AURORA™, which is available from ASM America, Inc. of Phoenix, Ariz. Other advanced dielectric substrates compatible with the present invention are polymeric and organic dielectrics such as SILK™ and BCB™ available from Dow Chemical, Inc. of Midland, Mich.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming, from a single copper alloy layer, a self-forming diffusion barrier layer and a copper seed layer, the method comprising: depositing the single copper alloy layer on a dielectric material, wherein the single copper alloy layer comprises at least 12.5 atomic percent magnesium or greater and whereby at least a portion of the magnesium in the single copper alloy layer can react with the dielectric material and thereby form the self-forming diffusion barrier layer at an interface between the single copper alloy layer and the dielectric material.

2. The method of claim 1 wherein the dielectric material comprises an oxide-based dielectric material and the diffusion barrier layer formed comprises magnesium oxide.

3. The method of claim 1 wherein the dielectric material comprises silicon dioxide.

4. The method of claim 1 wherein the dielectric material comprises a polymer-based dielectric material.

5. The method of claim 1 wherein the single copper alloy layer is less than about 1500 angstroms thick.

6. The method of claim 1 wherein the diffusion barrier layer is at least 10 angstroms thick.

7. The method of claim 1 further comprising removing at least some of magnesium from the single copper alloy layer.

8. The method of claim 1 further comprising annealing the single copper alloy layer by heating to a temperature of between about 50 and 500 degrees Centigrade for a period of about 5 and 500 seconds.

9. The method of claim 1 further comprising annealing the single copper alloy layer at a temperature of less than about 300 degrees Centigrade for a period of about 5 and 500 seconds, and heating the single copper alloy layer at a temperature of greater than about 350 degrees Centigrade for a period of between about 5 and 500 seconds.

10. The method of claim 1 further comprising annealing under vacuum conditions.

11. The method of claim 1 wherein the method is carried out as part of an integrated circuit process.

12. The method of claim 1 wherein the method is carried out as part of a Damascene process.

13. The method of claim 1 wherein the single copper alloy layer comprises 16.5 atomic percent magnesium or greater.

14. The method of claim 1 wherein the single copper alloy layer comprises 21 atomic percent magnesium or greater.

15. The method of claim 1 wherein the single copper alloy layer is deposited by sputtering a cathode target comprising separate copper and magnesium sections.

16. The method of claim 1 further comprising additional deposition of copper onto the single copper alloy layer.

17. The method of claim 15 wherein the sputtering is carried out using a hollow-cathode magnetron.

18. The method of claim 16 wherein the additional deposition is carried out by electrochemical deposition.

19. The method of claim 16 wherein the additional deposition is carried out by electroless deposition.

20. The method of claim 16 wherein the additional deposition is carried out by supercritical fluid deposition.

* * * * *